United States Patent [19]

Williams

[11] Patent Number: 4,930,001

[45] Date of Patent: May 29, 1990

[54] ALLOY BONDED INDIUM BUMPS AND METHODS OF PROCESSING SAME

[75] Inventor: Ronald L. Williams, San Marcos, Calif.

[73] Assignee: Hughes Aircraft Company, Los Angeles, Calif.

[21] Appl. No.: 327,867

[22] Filed: Mar. 23, 1989

[51] Int. Cl.$^5$ .................. H01L 23/48; B44C 1/22; C23F 1/02

[52] U.S. Cl. ................... 357/71; 156/633; 156/634; 156/656; 156/657; 156/659.1; 428/615; 428/620; 437/183

[58] Field of Search ............ 156/629, 630, 633, 634, 156/652, 656, 659.1, 664, 657; 437/183, 192, 209, 246; 428/615, 620; 357/71.

[56] References Cited

U.S. PATENT DOCUMENTS 4,740,700  4/1988  Shaham et al. .................... 250/332
4,796,082  1/1989  Murakami et al. ............. 437/184 X Primary Examiner—William A. Powell
Attorney, Agent, or Firm—W. C. Schubert; W. K. Denson-Low

[57] ABSTRACT

Apparatus comprising an indium bump that may be etched in a low concentration of hydrochloric acid (typically 1%) to remove oxide buildup, and a pad generally comprising a three layer arrangement of gold over nickel over titanium. The indium bump and the gold pad are pressed together for a short period of time, typically on the order of ten seconds, and then the pressed components are allowed to alloy weld over an extended period of time. Alternatively, the bump and pad may be heated at approximately 100 degrees Celsius for a period of about one hour to accelerate the alloy process. The heating diffuses the gold from the pad into the indium bump, thus forming a true alloy weld between the two that has incredibly strong bonding strength. Such bonding materials and methods are useful in bonding integrated circuit components, and the like.

15 Claims, 1 Drawing Sheet

ALLOY BONDED INDIUM BUMPS AND METHODS OF PROCESSING SAME

BACKGROUND

The present invention relates generally to fusion bonding, and more particularly to the alloy bonding of indium bumps to gold pads and methods of forming same which produce bonded bump and pad structure that are suitable for use in integrated circuits and their processing, and the like.

Prior art bump and pad arrangements have been around since the 1960's. These include the well-known solder to solder bump contact developed by IBM, the indium to indium bump contact developed by the Santa Barbara Research Center, a subsidiary of Hughes Aircraft Company, and the gold to gold bump contact developed by Honeywell. Each of these contacts is processed by means of a reflow procedure, and the bump and pad structures may be welded together in any conventional welding manner.

SUMMARY OF THE INVENTION

The present invention provides a unique approach in bump to pad bonding processes and contacts. The present invention comprises an indium bump and a pad generally comprising a three layer arrangement of gold over nickel over titanium. The indium bump and the gold pad are pressed together at a pressure of about 800 PSI for a short period of time, typically on the order of ten seconds, and then the pressed parts are heated at approximately 100 degrees Celsius for a period of about one hour. If required, the indium bump may be etched in a low concentration of hydrochloric acid (typically 1%) to remove any oxidation prior to pressing. The heating alloys the gold from the pad with the indium bump, thus forming a true weld between the two that has incredibly strong bonding strength.

One method of providing for alloy bonding of indium bumps in accordance with the present invention comprises the following steps. First, a conventional pad of aluminum, silicon or polysilicon is formed on an integrated circuit chip, for example at the location where an indium bump is to be formed. Then an indium bump is formed on the pad. The indium bump may be chemically etched in a low concentration of hydrochloric acid if the bump has been oxidized. A substrate is then provided and a conventional pad of aluminum, silicon or polysilicon is formed on the substrate. A layer of titanium is then deposited on the pad. Next, a layer of nickel is deposited on top of the layer of titanium, and finally a layer of gold is deposited on top of the layer of nickel.

The indium bump is then pressed onto the bonding pad for a short period of time to temporarily fuse the bump to the pad. The pressure used to fuse the bump to the pad is about 800 PSI while the time necessary to fuse the bump to the pad is about 10 seconds. The bump and pad begin to alloy at room temperature, and will form a complete alloy weld in a period of about three weeks at room temperature. However, the pressed bump and pad may be heated for about one hour at approximately 100 degrees Celsius to accelerate the formation of the alloy bond between the bump and the pad.

BRIEF DESCRIPTION OF THE DRAWING

The various features and advantages of the present invention may be more readily understood with reference to the following detailed description taken in conjunction with the accompanying drawing, wherein like reference numerals designate like structural elements, and in which.

DETAILED DESCRIPTION

Figure 1:
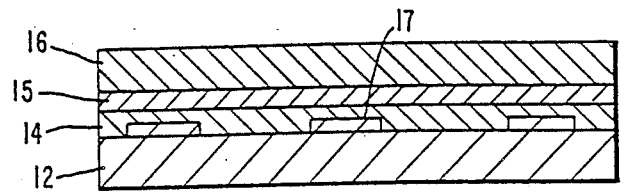
FIG. 1 illustrates one method of making a gold pad for use in the present invention.

With reference to FIG. 1, a gold contact pad utilized in the present invention may be fabricated as follows. A substrate 12 is provided. The substrate 12 may be comprised of any conventional substrate material, such as aluminum, silicon, or polysilicon, for example. A conventional pad 17 of aluminum, silicon or polysilicon is then formed on the substrate 12. A layer of titanium 14 is deposited on top of the pad 17 to a thickness of about 400 Angstroms. Then a layer of nickel 15 is deposited over the layer of titanium 14 to a thickness of about 1000 Angstroms. Then, a layer of gold 16 is deposited to a thickness of about 3000 Angstroms. The three deposited layers are then photolithographically etched in a conventional manner to form gold pads 20 (see FIG. 3) having a diameter of about 0.025 millimeters, or having generally square pads having a side dimension of about 0.020 millimeters.

Figure 2:
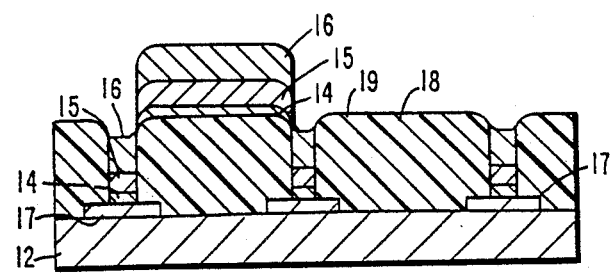
FIG. 2 illustrates a second method of making a gold pad for use in the present invention.

With reference to FIG. 2, a second method of forming a gold pad 20 is shown. This method uses a conventional lift-off process to form the pad 20. In this second method, a pad 17 is first formed on the substrate 12. A conventional photoresist layer 18 is deposited over the substrate 12 and pad 17 and is then patterned to form holes over the pads 17. Then the titanium 14, nickel 15 and gold 16 are deposited over the surface of the photoresist and in the holes in a manner described above. The layer of photoresist 18 is then removed in acetone, for example, to leave the formed gold pads 20. In addition, the indium bumps 11 (see FIG. 3) may also be formed using this procedure.

In general, the indium bumps 11 have a thickness in the range of 1-9 microns, the layer of nickel 15 has a thickness in the range of 200-3000 Angstroms, the layer of titanium 14 has a thickness in the range of 50-1000 Angstroms, and the layer of gold 16 has a thickness in the range of 1000-5000 Angstroms.

Figure 3:
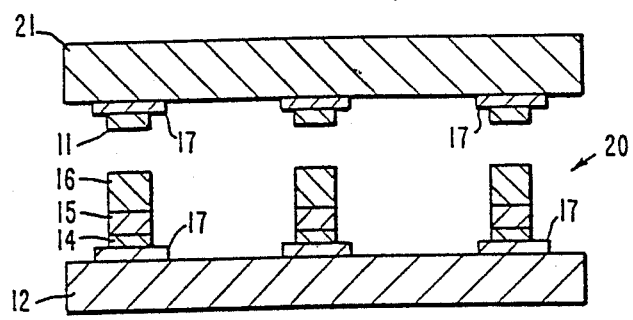
FIG. 3 illustrates an indium pad and gold bump contact in accordance with the principles of the present invention.

With reference to FIG. 3, both the indium pad 11 and gold contact pad 20 made in accordance with the principles of the present invention are shown. The indium bump 11, which may be disposed on an integrated circuit chip, for example, is formed by any conventional indium bump formation procedure, one of which is described above. Typically the indium bump 11 may have a diameter of about 0.025 millimeters and a height of about 0.006 millimeters, or may be a generally square configuration having a length and width dimension of about 0.020 millimeters, for example. The indium bump 11 may then be utilized in the present method just after formation. However, if it is allowed to oxidize, it is then etched in an approximately one percent (1%) solution of hydrochloric acid to remove the oxide. The oxide removal step lasts for approximately one week, and can be repeated as necessary.

Figure 4:
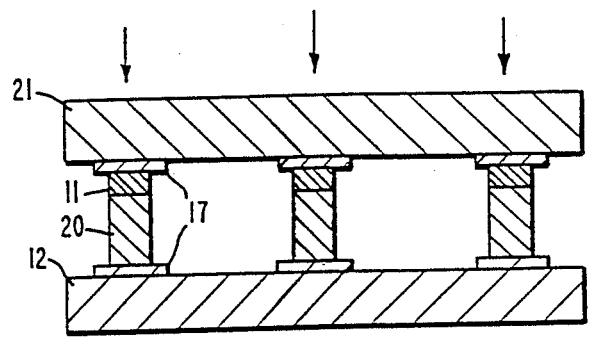
FIG. 4 illustrates an indium pad pressed onto the gold bump contact and is also useful in discussing the method of fabricating a welded structure employing same.

With reference to FIG. 4, the indium bump 11 may then be alloy bonded to the gold pad 20 by pressing the two together at a pressure of about 800 pounds per square inch for about ten seconds. This pressure temporarily fuses the two components together. Then, the fused bump 11 and pad 20 are heated at a temperature of about 100 degrees Celsius for approximately one hour. The heating of the components diffuses the gold into the indium and forms a diffusion weld.

Tests performed on structures bonded in the above-described manner indicated that the high strength bonding occurred between the indium and gold. In particular, after prying the structures apart, it revealed that 80 percent of the failure was cohesive in indium, 15 percent at the indium to titanium nickel interface, and only five percent at the gold interface. All separations showed signs of metal tearing.

The present invention thus provides for a high strength alloy welding technique suitable for use in semiconductor and hybrid microcircuit packaging. In particular, the present invention may be employed to replace wire bonding of certain integrated circuits to their packages. The present invention may be employed to attach microwave circuits to packages where the interconnections have no inductance. Consequently the connections would not limit the data rate of the integrated circuit. This is contrasted to conventional wire bonds which create inductances and therefore limit the operating speed of the microwave integrated circuits. In order to form the package, the integrated circuit would have indium bumps formed on the bottom surface thereof and then it would be "flip chipped" and pressed onto corresponding gold or gold-plated pads formed on the package. Subsequent heating of the pressed structure would weld the parts together.

Conventional focal plane arrays generally employ indium bump arrays thereon and in order to adequately bond these to indium pads, for example, the bumps and pads are cold welded and then adhesive bonded. The adhesive employed in such structures has a dielectric constant on the order of 3. Without adhesive, vacuum has a dielectric constant of 1. Consequently, by employing the method of the present invention and having air as the dielectric around the bonding sites, the parallel capacitance is improved by a factor of three, and therefore the theoretical data rate is improved by a factor of 3.

Thus there has been described a new and improved technique of alloy bonding indium bumps to gold pads which produce bonded bump and pad structures that are suitable for use in integrated circuits, and the like. It is to be understood that the above-descried embodiment is merely illustrative of some of the many specific embodiments which represent applications of the principles of the present invention. Clearly, numerous and other arrangements can be readily devised by those skilled in the art without departing from the scope of the invention.

What is claimed is:

1. A method of providing for alloy bonding of indium bumps comprising the steps of:
   providing an indium bump;
   providing a substrate;
   providing a gold bonding pad disposed on the substrate;
   pressing the indium bump onto the bonding pad for a short period of time to temporarily fuse the bump to the pad; and
   allowing the bump and bonding pad to completely alloy over an extended period of time.

2. The method of claim 1 further comprising the step of:
   etching the indium bump in a low concentration of hydrochloric acid to remove oxide therefrom.

3. The method of claim 1 further comprising the step of:
   heating the pressed bump and pad for about one hour at approximately 100 degrees Celsius to accelerate the alloy bond between the bump and the pad.

4. The method of claim 2 further comprising the step of:
   heating the pressed bump and pad for about one hour at approximately 100 degrees Celsius to accelerate the alloy bond between the bump and the pad.

5. A method of providing for alloy bonding of indium bumps comprising the steps of:
   providing an indium bump;
   providing a substrate;
   providing a gold plated bonding pad disposed on the substrate;
   pressing the indium bump onto the bonding pad for a short period of time to temporarily fuse the bump to the pad; and
   heating the pressed bump and pad for about one hour at approximately 100 degrees Celsius to accelerate the alloy bond between the bump and the pad.

6. A method of providing for alloy bonding of indium bumps comprising the steps of:
   providing an indium bump;
   etching the indium bump in a low concentration of hydrochloric acid;
   providing a substrate;
   providing a gold plated bonding pad disposed on the substrate;
   pressing the etched indium bump onto the bonding pad for a short period of time to temporarily fuse the bump to the pad; and
   heating the pressed bump and pad for about one hour at approximately 100 degrees Celsius to accelerate the alloy bond between the bump and the pad.

7. A method of providing for alloy bonding of indium bumps comprising the steps of:
   providing an indium bump;
   etching the indium bump in a low concentration of hydrochloric acid;
   providing a substrate;
   providing a bonding pad disposed on the substrate comprising a layer of titanium, a layer of nickel deposited over the titanium and a layer of gold deposited over the layer of titanium;
   pressing the etched indium bump onto the bonding pad for a short period of time to initiate the alloy process between the bump to the pad; and
   heating the pressed bump and pad for about one hour at approximately 100 degrees Celsius to form a alloy bond between the bump and the pad.

8. A method of providing for alloy bonding of indium bumps comprising the steps of:
   providing an indium bump;
   providing a substrate;
   depositing a layer of titanium on the substrate;
   depositing a layer of nickel on top of the layer of titanium;

depositing a layer of gold on top of the layer of nickel;

photolithographically etching the layers of titanium, nickel and gold to form a gold plated bonding pad; and pressing the indium bump onto the bonding pad for a short period of time to temporarily fuse the bump to the pad.

9. The method of claim 8 further comprising the step of:

chemically etching the indium bump in a low concentration of hydrochloric acid.

10. The method of claim 8 further comprising the step of:

heating the pressed bump and pad for about one hour at approximately 100 degrees Celsius to accelerate the alloy bond between the bump and the pad.

11. The method of claim 9 further comprising the step of:

heating the pressed bump and pad for about one hour at approximately 100 degrees Celsius to accelerate the alloy bond between the bump and the pad.

12. Apparatus comprising:

a substrate;

a gold bonding pad disposed on the substrate;

an indium bump pressed onto the gold bonding pad for a short period of time to temporarily fuse the bump to the pad and allowed to cure for an extended period of time to form an alloy bond between the bump and the pad.

13. Apparatus comprising:

a substrate;

a gold bonding pad disposed on the substrate;

an indium bump pressed onto the gold bonding pad for a short period of time to temporarily fuse the bump to the pad and heated for about one hour at approximately 100 degrees Celsius to form an alloy bond between the bump and the pad.

14. Apparatus comprising:

a substrate;

a gold bonding pad disposed on the substrate;

an indium bump etched in a low concentration of hydrochloric acid and pressed onto the gold bonding pad for a short period of time to temporarily fuse the bump to the pad and heated for about one hour at approximately 100 degrees Celsius to form an alloy bond between the bump and the pad.

15. Apparatus comprising:

a substrate;

a bonding pad disposed on the substrate comprising a layer of titanium, a layer of nickel deposited over the titanium and a layer of gold deposited over the layer of titanium;

an indium bump etched in a low concentration of hydrochloric acid and pressed onto the bonding pad for a short period of time to temporarily fuse the bump to the pad and heated for about one hour at approximately 100 degrees Celsius to form an alloy bond between the bump and the pad.

* * * * *